United States Patent
Lee et al.

(10) Patent No.: US 11,715,947 B2
(45) Date of Patent: Aug. 1, 2023

(54) ELECTROSTATIC DISCHARGE PROTECTION CIRCUIT

(71) Applicant: DB HiTek Co., Ltd., Seoul (KR)

(72) Inventors: Sang Mok Lee, Incheon (KR); Joon Tae Jang, Seoul (KR); Won Suk Park, Bucheon-si (KR); Li Yan Jin, Bucheon-si (KR); Seung Hoo Kim, Seoul (KR)

(73) Assignee: DB HiTek, Co., Ltd., Seoul (KR)

( * ) Notice: Subject to any disclaimer, the term of this patent is extended or adjusted under 35 U.S.C. 154(b) by 23 days.

(21) Appl. No.: 17/555,405

(22) Filed: Dec. 18, 2021

(65) Prior Publication Data

US 2022/0239095 A1 Jul. 28, 2022

(30) Foreign Application Priority Data

Jan. 27, 2021 (KR) .......... 10-2021-0011535

(51) Int. Cl.
*H02H 9/04* (2006.01)
(52) U.S. Cl.
CPC .................. *H02H 9/046* (2013.01)
(58) Field of Classification Search
CPC . H02H 9/046; H01L 27/0266; H01L 27/0285; H01L 27/0288; H03K 19/0016; H03K 19/00315
USPC ............................................ 361/56
See application file for complete search history.

(56) References Cited

U.S. PATENT DOCUMENTS

| | | | | |
|---|---|---|---|---|
| 5,319,259 A | * | 6/1994 | Merrill | H03K 19/00315 326/62 |
| 7,978,450 B1 | * | 7/2011 | Perisetty | H02H 9/046 361/118 |
| 2008/0316660 A1 | * | 12/2008 | Huang | H02H 9/046 361/56 |
| 2009/0091870 A1 | * | 4/2009 | Huang | H02H 9/046 361/56 |
| 2013/0063844 A1 | * | 3/2013 | Sun | H01L 27/0285 361/56 |
| 2015/0245546 A1 | * | 8/2015 | Lin | H01G 17/00 361/56 |
| 2015/0270258 A1 | * | 9/2015 | Dabral | H02H 3/22 361/56 |
| 2022/0239095 A1 | * | 7/2022 | Lee | H01L 27/0266 |

* cited by examiner

*Primary Examiner* — Dharti H Patel
(74) *Attorney, Agent, or Firm* — Andrew D. Fortney; Central California IP Group, P.C.

(57) ABSTRACT

An electrostatic discharge (ESD) protection circuit includes an ESD detector connected between a pad and a first power source and configured to generate a detection signal when ESD is detected at the pad, a switch transistor including a gate controlled by the detection signal and a source and a drain connected between the pad and the memory, and a leakage current prevention circuit including a first transistor including a first gate connected to a second power source and a source and a drain connected between the pad and a first node, and a second transistor including a second gate connected to the pad and a source and a drain connected between the first node and the second power source. The first node is connected to or in electrical communication with a bulk node of the switch transistor.

20 Claims, 3 Drawing Sheets

ELECTROSTATIC DISCHARGE PROTECTION CIRCUIT

This application claims the benefit of Korean Patent Application No. 10-2021-0011535, filed on Jan. 27, 2021, incorporated herein by reference as if fully set forth herein.

BACKGROUND OF THE INVENTION

Field of the Invention

Embodiments of the present disclosure relate to an electrostatic discharge protection circuit and an input/output circuit including the same.

Discussion of the Related Art

The input/output circuit of an electronic device may function as an electrical interface between an internal circuit of the electronic device and an external circuit outside the electronic device. The input/output circuit of the electronic device may transmit or receive a voltage signal between the internal circuit and the external circuit.

When a surge voltage occurs at an input/output pad of the input/output circuit, the input/output circuit limits current that might otherwise flow to the internal circuit through a resistor or a switch connected to the input/output circuit using an electrostatic discharge (ESD) protection circuit, which discharges excessive current to a ground node, thereby protecting the internal circuit. When the ESD protection circuit of the input/output circuit fails to completely divert the current from the internal circuit, an error may occur in programming the internal circuit, especially when the internal circuit includes a memory.

SUMMARY OF THE INVENTION

Accordingly, the present invention is directed to an electrostatic discharge protection circuit that substantially obviates one or more problems due to limitations and disadvantages of the related art.

An object of embodiments of the disclosure is to provide an electrostatic discharge circuit that may block a surge caused by electrostatic discharge from being introduced into a memory and prevent leakage current.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose of the invention, as embodied and broadly described herein, according to one or more embodiments, an electrostatic discharge (ESD) protection circuit between a pad and a memory includes an ESD detector connected between the pad and a first power source and configured to generate a detection signal when ESD is detected at the pad, a switch transistor including a gate controlled by the detection signal and a source and a drain connected between the pad and the memory, and a leakage current prevention circuit including a first transistor including a first gate connected to a second power source and a source and a drain connected between the pad and a first node, and a second transistor including a second gate connected to the pad and a source and a drain connected between the first node and the second power source. The first node is connected to or in electrical communication with a bulk node of the switch transistor.

The ESD protection circuit may further include a floating N-well node connected to or in electrical communication with the first node.

The floating N-well node may also be connected to or in electrical communication with a bulk node of the first transistor.

The floating N-well node may also be connected to or in electrical communication with a bulk node of the second transistor.

The ESD detector may include a capacitor connected between the pad and a second node, a resistor connected between the second node and the first power source, and a discharge transistor including a gate connected to the second node, and a source and a drain connected between the pad and the first power source. The detection signal may be output from the second node.

The capacitor may be or comprise a transistor including a gate connected to the second node and a source and a drain connected to the pad.

The ESD protection circuit may further include a buffer circuit configured to buffer the detection signal and apply the buffered detection signal to the gate of the switch transistor.

The ESD protection circuit may further include a first inverter and a second inverter connected in series, the detection signal may be input to the first inverter, and an output of the second inverter may be input to the gate of the switch transistor.

The ESD protection circuit may further include a first P-type metal oxide semiconductor (PMOS) transistor including a gate connected to the second node and a source and a drain connected between the second power source and a third node, a first N-type metal oxide semiconductor (NMOS) transistor including a gate connected to the second node and a source and a drain connected between the third node and the first power source, a second PMOS transistor including a gate connected to the third node and a source and a drain connected between the pad and the gate of the switch transistor, and a second NMOS transistor including a gate connected co the third node and a source and a drain connected between the first power source and the gate of the switch transistor.

A voltage of the second power source may be greater than a voltage of the first power source.

The floating N-well node may be connected to or in electrical communication with a bulk node of the second PMOS transistor.

Each of the first transistor and the second transistor may be or comprise a PMOS transistor. The switch transistor may be or comprise a PMOS transistor.

According to another embodiment, an ESD protection circuit connected between a pad and a memory includes an ESD detector connected between the pad and a first power source and configured to generate a detection signal when ESD is detected at the pad, a switch transistor including a gate controlled by the detection signal and a source and a drain connected between the pad and the memory, and a leakage current prevention circuit including a first transistor including a first gate connected to a second power source and a source and a drain connected between the pad and a first node, and a second transistor including a second gate connected to the pad and a source and a drain connected between the first node and the second power source. The first node is connected to or in electrical communication with a bulk node of the first transistor and a bulk node of the second transistor.

The ESD protection circuit may further include a floating N-well node connected to or in electrical communication with the first node, and a voltage of the second power source may be greater than a voltage of the first power source.

The ESD protection circuit may further include a first PMOS transistor including a gate connected to a second node of the ESD detector outputting the detection signal, and a source and a drain connected between the second power source and a third node, a first NMOS transistor including a gate connected to the second node and a source and a drain connected between the third node and the first power source, a second PMOS transistor including a gate connected to the third node and a source and a drain connected between the pad and the gate of the switch transistor, and a second NMOS transistor including a gate connected to the third node and a source and a drain connected between the first power source and the gate of the switch transistor.

The floating N-well node may be connected to or in electrical communication with a bulk node of the switch transistor and a bulk node of the second PMOS transistor. The switch transistor may be or comprise a PMOS transistor. Each of the first transistor and the second transistor may be or comprise a PMOS transistor.

According to another embodiment, an ESD protection circuit connected between a pad and a memory includes an ESD detector connected between the pad and a first power source and configured to generate a detection signal when ESD is detected at the pad, a switch transistor including a gate controlled by the detection signal and a source and a drain connected between the pad and the memory, a first transistor including a first gate connected to a second power source and a source and a drain connected between the pad and a first node, and a second transistor including a second gate connected to the pad, and a source and a drain connected between the first node and the second power source, a first PMOS transistor including a gate connected to a second node of the ESD detector outputting the detection signal, and a source and a drain connected between the second power source and a third node, a first NMOS transistor including a gate connected to the second node, and a source and a drain connected between the third node and the first power source, a second PMOS transistor including a gate connected to the third node, and a source and a drain connected between the pad and the gate of the switch transistor, and a second NMOS transistor including a gate connected to the third node, and a source and a drain connected between the first power source and the gate of the switch transistor. The first node is connected to or in electrical communication with at least one of a bulk node of the first transistor, a bulk node of the second transistor, a bulk node of the switch transistor, and a bulk node of the second PMOS transistor.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Figure 1:
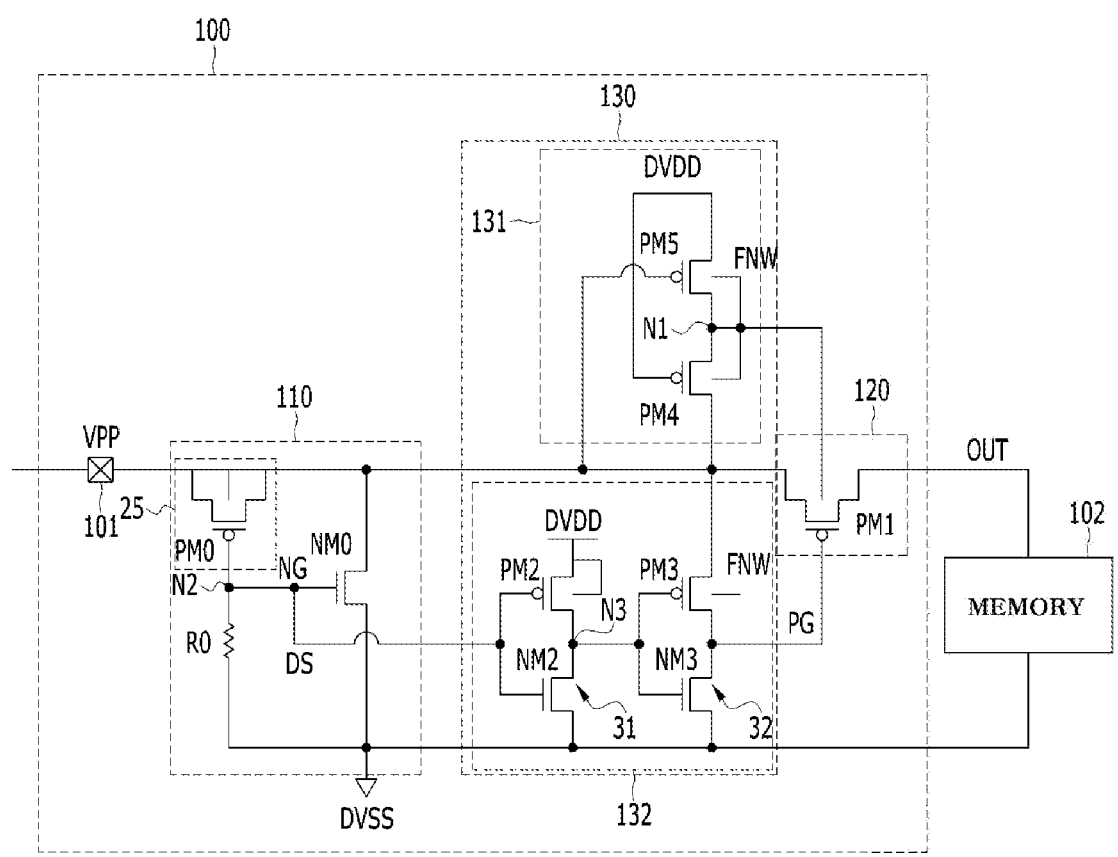
FIG. 1 is a diagram illustrating an exemplary electrostatic discharge (ESD) protection circuit according to an embodiment of the disclosure.

Reference will now be made in detail to embodiments of the present invention, examples of which are illustrated in the accompanying drawings.

In the following description of various embodiments it will be understood that, when an element is referred to as being "on" or "under" another element, it can be directly on or under the other element, or one or more intervening elements may be present between the elements. Furthermore, when the expression "on" or "under" is used herein, it may involve not only the upward direction, but also the downward direction, with reference to the element.

In addition, it will be understood that relative terms used hereinafter such as "first", "second", "on"/"above"/"over" and "under"/"below"/"beneath" may be construed only to distinguish one element from another element without necessarily requiring or involving a certain physical or logical relation sequence between the elements. In addition, the same reference numerals will be used throughout the drawings to refer to the same or like parts.

The term "float" or "floating" may be used in the description to indicate that a particular part of a circuit may be electrically isolated from power supply nodes under certain conditions, and/or is not limited to any particular voltage value.

The present invention relates to an electrostatic discharge (ESD) protection circuit 100 connected between a pad 101 and an internal circuit 102. When a surge voltage or a surge current occurs at the pad 101 (e.g., by ESD), the ESD protection circuit 100 diverts or shunts the surge voltage or surge current from the internal circuit 102.

For example, the pad 101 may be an input/output pad. For example, the internal circuit 102 may be, but is not limited to, a memory (e.g., a nonvolatile memory that may be programmed using voltage greater than the upper rail power supply for logic transistors, commonly referred to as "VDD"). As far as it is capable of receiving data or a signal, any device is available as the internal circuit 102. Hereinafter, the internal circuit 102 is represented as a memory.

Further, the embodiment may include an input/output circuit including the pad 101 and the ESD protection circuit 100.

FIG. 1 is a diagram illustrating an exemplary configuration of the ESD protection circuit 100 according to an embodiment of the disclosure.

Referring to FIG. 1, the ESD protection circuit 100 includes an ESD detector 110, a switch 120, and a switch controller 130. In another embodiment, the ESD protection circuit 100 may include the pad 101.

The ESD detector 110 is connected to the pad 101, detects ESD that occurs at the pad 101, and discharges ESD introduced to the pad 101 when the ESD is detected. For example, the ESD detector 110 may be connected between the pad 101 and a first power source DVSS.

For example, the ESD detector 110 may generate a detection signal DS when the ESD is detected at the pad 101 and output the generated detection signal DS.

The switch 120 is connected between the pad 101 and the memory 102, may be turned on or off based on the detection signal DS output from the ESD detector 110, and may electrically short-circuit (e.g., connect) or disconnect the pad 101 and the memory 102.

The switch controller 130 controls the turn-on or turn-off of the switch 120 based on the detection signal DS.

The term "ESD detector" may be used interchangeably with the terms "ESD detection circuit" and/or "ESD detection unit".

For example, the ESD detector 110 may include a capacitor 25 connected to the pad 101, a resistor R0, and a discharge transistor NM0.

The discharge transistor NM0 may include a gate NG and a source and a drain connected between the pad 101 and the first power source DVSS. The resistor R0 may be connected between the gate NG of the discharge transistor NM0 and the first power source DVSS. The capacitor 25 is connected between the pad 101 and a connection node to which the gate NG of the discharge transistor NM0 and the resistor R0 are connected.

For example, the node at which the capacitor 25, the resistor R0, and the gate PG of the discharge transistor NM0 are connected to each other is a "detection node" or a "second node N2," which also carries or outputs the detection signal DS. The first power source DVSS may also be expressed as a "first power node" or a "first power source."

For example, the capacitor 25 may be, but is not limited to, a metal oxide semiconductor (MOS) capacitor, for example, a P-type MOS (PMOS) transistor configured as a capacitor.

For example, the capacitor 25 may include a gate connected to the second node N2, and a source and a drain connected to the first pad 101. In addition, the substrate (e.g., a Si body or p-substrate) of the PMOS capacitor 25 may also be electrically connected to the pad 101.

For example, the discharge transistor NM0 may be, but is not limited to, an N-type MOS (NMOS) transistor. In another embodiment, the discharge transistor NM0 may be implemented as a PMOS transistor.

The switch 120 may include a gate, and a source and a drain connected between the pad 101 and the memory 102. For example, the switch 120 may include a switch transistor, for example, a PMOS transistor PM1. For example, the memory 102 may be, but is not limited to, a one-time programmable (OTP) memory comprising a plurality of OTP memory cells.

For example, the PMOS transistor PM1 may include a gate, and a source and a drain connected between the pad 101 and the memory 102. For example, the source of the PMOS transistor PM1 may be connected to the pad 101, and the drain of the PMOS transistor PM1 may be connected to the memory 102. For example, the gate of the MOS transistor PM1 may be controlled based on the detection signal DS.

The switch controller 130 includes a first controller 131 and a second controller 132.

The first controller 131 includes a first transistor PM4 including a first gate connected to a second power source DVDD, and a source and a drain connected between the first pad 101 and a first node N1, and a second transistor PM5 including a second gate connected to the first pad 101, and a source and a drain connected between the first node N1 and the second power source DVDD. The second power source DVDD may also be expressed as a "second power source" and/or a "second power node". For example, a voltage of the second power source DVDD may be greater than a voltage of the first power source DVSS.

The first node N1 may be a connection node between the first transistor PM4 and the second transistor PM5. The first node N1 may be electrically connected to a floating N-well node FNW. For example, each of the first transistor PM4 and the second transistor PM5 may be or comprise a PMOS transistor.

For example, the floating N-well node FNW may be connected to or in electrical communication with a bulk (or body) or bulk node (or body node) of each of the first transistor PM4 and the second transistor PM5. The bulk of a transistor may be the bulk node of the transistor, and the body node of the transistor may be or comprise the body (e.g., a P-type body) of the transistor.

The floating N-well node FNW may be connected to or in electrical communication with the bulk (or body) or bulk node (or body node) of the PMOS transistor PM1 in the switch 120.

For example, the floating N-well node FNW may be a common bulk node of one or more PMOS transistors (e.g., PM1, PM3, PM4, and/or PM5) connected to the first node N1.

The first controller 131 is for preventing current leakage from the pad 101 (e.g., through the switch 120), and may also be expressed as a "leakage current prevention circuit".

The second controller 132 may also be expressed as a "delay unit" or a "buffer circuit". For example, the second controller 132 may include at least one inverter. For example, the second controller 132 may include two or more inverters connected in series.

For example, the second controller 132 may include a first inverter 31 and a second inverter 32 connected in series. The detection signal DS is input to the first inverter 31, the output of the first inverter 31 is input to the second inverter 32, and the output of the second inverter 32 is input to the gate of the PMOS transistor PM1 of the switch 120.

For example, each of the first inverter 31 and the second inverter 32 may be a complementary MOS (CMOS) inverter.

For example, the first inverter 31 may be a CMOS inverter including a PMOS transistor PM2 and an NMOS transistor NM2.

For example, the detection signal DS may be input to a common connection gate of the PMOS transistor PM2 and the NMOS transistor NM2 (i.e., an input terminal of the first inverter 31), and the PMOS transistor PM2 and the NMOS transistor NM2 may be connected between the first power source DVSS and the second power source DVDD. The first inverter 31 may be biased by a voltage of the first power source DVSS and a voltage of the second power source DVDD, and may output the voltage of the first power source DVSS or the voltage of the second power source DVDD.

For example, the PMOS transistor PM2 may include a gate connected to the second node N2, and a source and a drain connected between the second power source DVSS and a third node N3. The NMOS transistor NM2 may include a gate connected to the second node N2, and a source and a drain connected between the third node N3 and the first power source DVSS. The PMOS transistor PM3 may include a gate connected to the third node N3, and a source and a drain connected between the pad 101 and the gate of the switch transistor PM1. An NMOS transistor NM3 may include a gate connected to the third node N3, and a source and a drain connected between the first power source DVSS and the gate of the switch transistor PM1.

For example, the source of the PMOS transistor PM2 of the first inverter 31 may be connected to or in electrical communication with the bulk (or body) of the PMOS transistor PM2.

The second inverter 32 may be a CMOS inverter including a PMOS transistor PM3 and an NMOS transistor NM3.

For example, the output of the first inverter 31 may be input to the common connection gate (i.e., an input terminal of the second inverter 32) of the PMOS transistor PM3 and the NMOS transistor NM3 of the second inverter 32, the PMOS transistor PM3 and the NMOS transistor NM3 may be connected between the first power source DVSS and the pad 101. The second inverter 32 may be biased by the voltage of the first power source DVSS and a voltage VPP of the pad 101, and may output the voltage of the first power source DVSS or the voltage VPP of the pad 101.

The floating N-well node FNW may be connected to or in electrical communication with the bulk (or body) or bulk node (body node) of the PMOS transistor PM3 of the second inverter 32.

The output of the second inverter 32 may be input to the gate PG of the PMOS transistor PM1 of the switch 120.

The ESD protection circuit 100 of FIG. 1 includes, but is not limited to, both the first controller 131 and the second controller 132. In another embodiment, one of the first controller 131 and the second controller 132 may be omitted.

Further, in the ESD protection circuit 100 of FIG. 1, the floating N-well node FNW (or the first node N1) is connected to or in electrical communication with the hulk node of the first transistor PM4 of the leakage current prevention circuit 131, the bulk node of the second transistor PM5, the bulk node of the switch transistor PM1, and the bulk node of the PMOS transistor PM3, but is not limited to such connections or electrical communications. In another embodiment, the floating N-well node FNW (or the first node N1) may be connected to or in electrical communication with at least one of the bulk node of the first transistor PM4 of the leakage current prevention circuit 131 the bulk node of the second transistor PM5, the bulk node of the switch transistor PM1, or the bulk node of the PMOS transistor PM3.

Figure 2A:
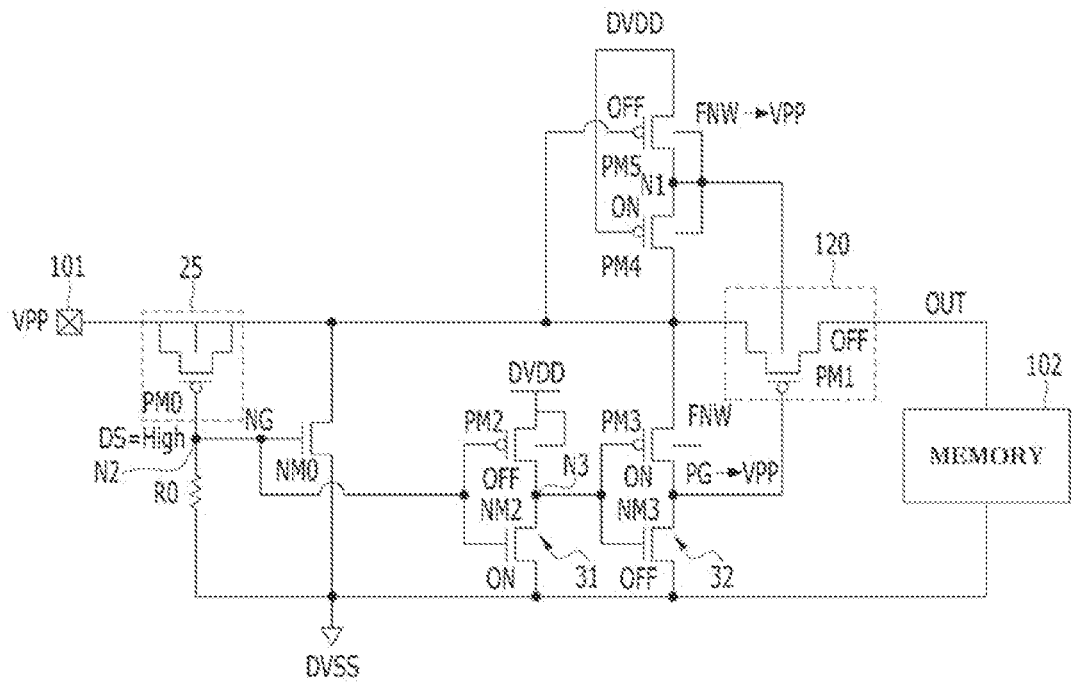
FIGS. 2A and 2B are diagrams illustrating ESD protection operations of the ESD protection circuit illustrated in FIG. 1.
Figure 2B:
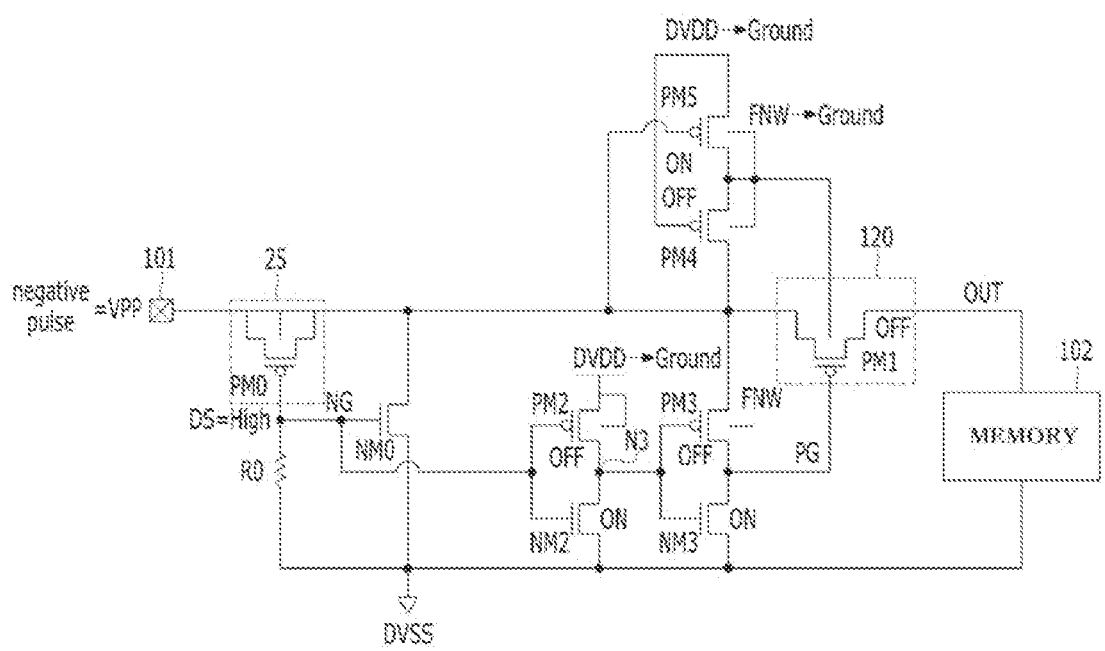

FIGS. 2A and 2B illustrate operations of the ESD protection circuit 100 illustrated in FIG. 1 in an ESD protection mode (e.g., during normal operation of the integrated circuit).

A surge voltage may occur at the pad 101 due to an ESD event or ESD charge applied to the pad 101.

FIG. 2A illustrates a case in which a positive ESD pulse occurs at the pad 101, which may be based on the second power source DVDD. The phrase "based on the second power source DVDD" may mean due to a connection between the second power source DVDD and the ground (e.g., a ground potential or the first power source DVSS).

When a surge voltage occurs at the pad 101, the capacitor 25 causes the voltage on the second node N2 to rise to a high state. That is, the detection signal DS is in a high digital logic state. As the detection signal DS becomes high, the discharge transistor NM0 turns on, and the surge voltage on the pad 101 may be discharged to the first power source DVSS.

In addition, the second transistor PM5 is turned off, but since the voltage of the second power source DVDD is very low (e.g., 0 V) relative to the surge voltage, the first transistor PM4 is turned on, and the floating N-well node FNW follows the voltage VPP of the pad 101 in the first controller 131.

Further, since the detection signal DS is in the high state, the NMOS transistor NM2 is turned on and the PMOS transistor PM2 is turned off in the first inverter 31, and the NMOS transistor NM3 is turned off and the PMOS transistor PM3 is turned on in the second inverter 32. As a result, the PMOS transistor PM1 of the switch 120 is turned off and has a high impedance, thereby blocking current from flowing from the pad 101 to the memory 102.

Even when a high surge voltage occurs at the pad 101, the floating N-well node FNW follows the voltage VPP of the pad 101, and the voltage of each of the bulk of the PMOS transistor PM1 of the switch 120, the bulk of the transistor PM1, the bulk of the first transistor PM4, and the bulk of the PMOS transistor PM3 of the second inverter 32, which are connected to the floating N-well node FNW, becomes the voltage VPP of the pad 101. Therefore, it is possible to prevent leakage current from flowing from the pad 101 to the bulk of the PMOS transistor PM1, the bulk of the first transistor PM4, and/or the bulk of the PMOS transistor PM3 of the second inverter 32.

FIG. 2B illustrates a case in which a negative ESD pulse occurs at the pad 101, which may be based on the second power source DVDD. Referring to FIG. 2B, since the PMOS transistor PM3 is turned off, and the NMOS transistor NM3 is turned on in the second inverter 32, the voltage on the gate PG of the PMOS transistor PM1 in the switch 120 becomes the voltage of the first power source DVSS. Therefore, the voltage on the gate PG of the PMOS transistor PM1 in the switch 120 becomes higher than the voltage on the pad 101, and thus the PMOS transistor PM1 is turned off and has a high impedance, thereby blocking current from flowing from the pad 101 to the memory 102.

Next, when a positive ESD pulse occurs at the pad 101, which may be based on the first power DVSS, the detection signal DS is in the high state, the NMOS transistor NM2 of the first inverter 31 is turned on, and the PMOS transistor PM3 of the second inverter 32 is turned on, and the PMOS transistor PM1 is turned off and has a high impedance, thereby blocking current flowing from the pad 101 to the memory 102. Herein, the phrase "based on the first power source DVSS" may mean due to a connection of the first power source DVSS to the ground.

Finally, even when a positive ESD pulse occurs at the pad 101, which may be based on the first power DVSS, the MOS transistor PM1 is turned off and has a high impedance, thereby blocking current from flowing from the pad 101 to the memory 102.

Figure 3:
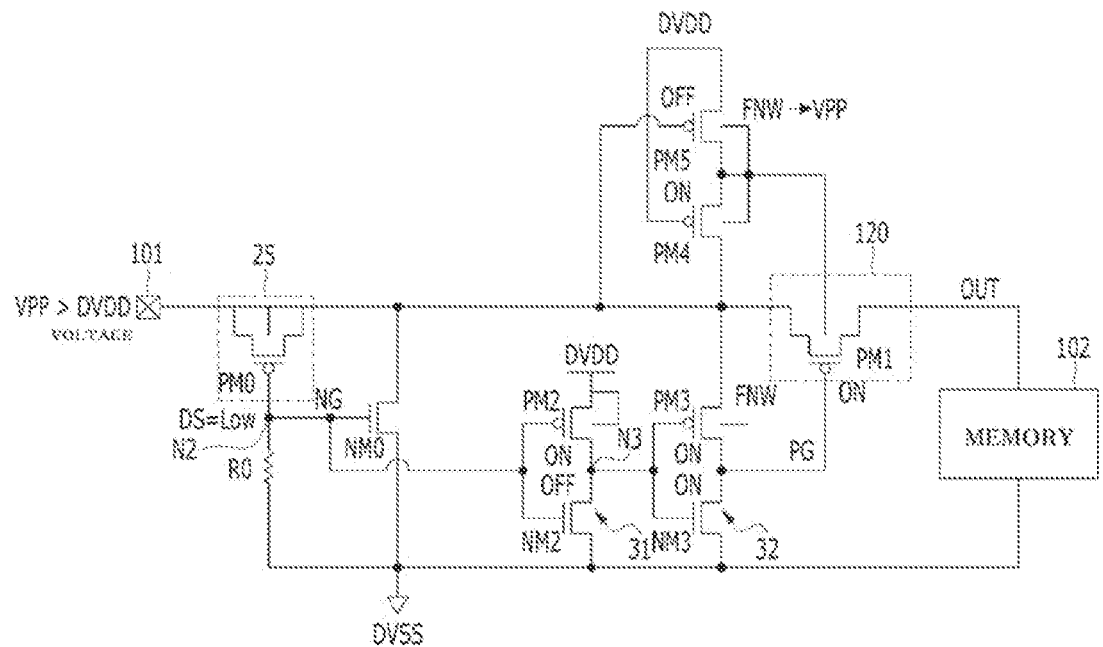
FIG. 3 is a diagram illustrating an operation of the ESD protection circuit during programming of the memory.

FIG. 3 illustrates an operation of the ESD protection circuit 100 during a programming mode, in which one or more cells of the memory are programmed.

Referring to FIG. 3, in a program mode, an operating voltage higher than the voltage of the second power source DVDD occurs at the pad 101. That is, in the program mode, the voltage VPP of the pad 101 may be higher than the voltage of the second power source DVDD, but lower than a surge voltage or pulse voltage caused by ESD.

In the programming mode, the voltage on the second node N2 across the capacitor 25 becomes low (e.g., 0 V), and the discharge transistor NM0 is turned off. Since the detection signal DS is in a low state, the NMOS transistor NM2 of the first inverter 31 may be turned off, the PMOS transistor PM2 may be turned on, the voltage of the second power source DVDD may be applied to the gate of the second inverter 32, and both the PMOS transistor PM3 and the NMOS transistor NM3 of the second inverter 32 may be turned on.

For example, the width W1 of the gate of the NMOS transistor NM3 (or the ratio W1/L1 of the width W1 of the gate to the length L1 of the gate) of the NMOS transistor NM3 may be larger than the width W2 of the gate of the PMOS transistor PM3 (or the ratio W1/L1 of the width W2 of the gate to the length L2 of the gate) of the PMOS transistor PM3.

That is, the current sinking ability of the NMOS transistor NM3 may be greater than the current sourcing ability of the PMOS transistor PM3. Therefore, because the NMOS transistor NM3 may sink more current (e.g., significantly more current) than the PMOS transistor PM3 can source, the PMOS transistor PM1 of the switch 120 may turn on and have a low impedance, and the voltage VPP of the pad 101 may be applied to the memory 102 to program the memory 102.

Further, since the first transistor PM4 is on and the second transistor PM5 is off in the first controller 131, the voltage of the floating N-well node FNW follows the voltage VPP of the pad 101 and thus becomes equal to the voltage of the pad 101.

Figure 4:
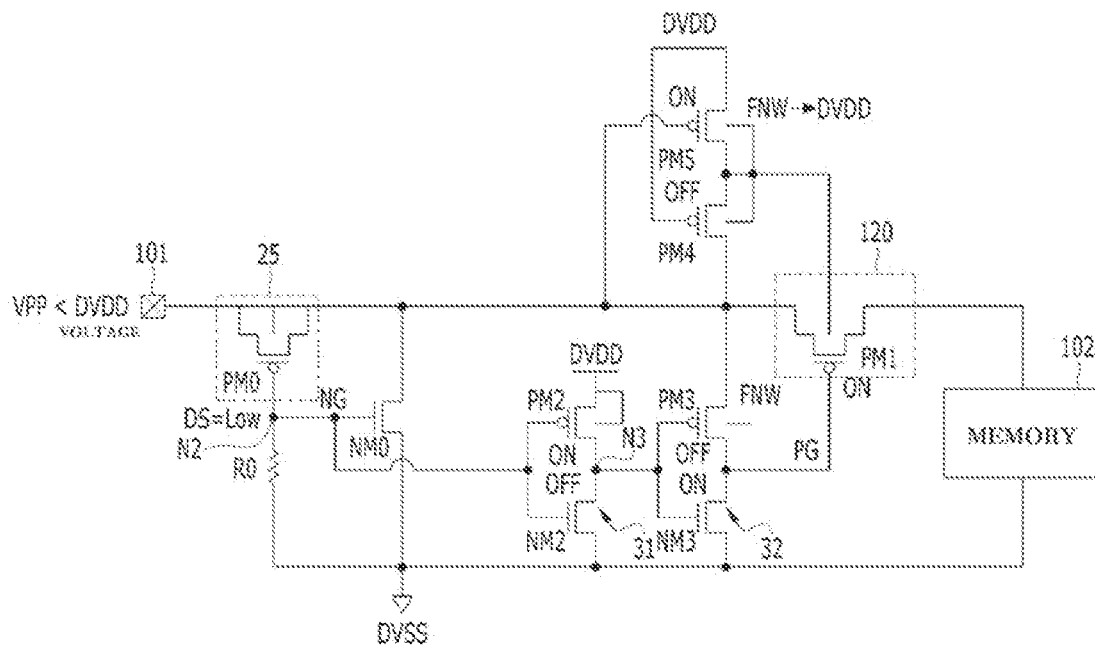
FIG. 4 is a diagram illustrating an operation of the ESD protection circuit during reading of the memory.

FIG. 4 is a diagram illustrating an operation of the ESD protection circuit 100 during a reading mode (e.g., when the memory 102 is being read).

Referring to FIG. 4, in the reading mode, an operating voltage higher than the voltage of the first power source DVSS and lower than the voltage of the second power source DVDD occurs at the pad 101. That is, in the reading mode, the voltage VPP of the pad 101 may be higher than the voltage of the first power source DVSS and lower than the voltage of the second power source DVDD.

In the read mode, the voltage on the second node N2 across the capacitor 25 becomes low (e.g., 0 V), and the discharge transistor NM0 is turned off. Since the detection signal DS is in the low state, the NMOS transistor NM2 may be turned off and the PMOS transistor PM2 may be turned on in the first inverter 31, the voltage of the second power source DVDD may be applied to the gate of the second inverter 32, and the PMOS transistor PM3 may be turned off and the NMOS transistor NM3 may be turned on in the second inverter 32.

Since the NMOS transistor NM3 is turned on, the PMOS transistor PM1 of the switch 120 is turned on and has a low impedance, and the voltage VPP of the pad 101 may be applied to the memory 102 to read the memory 102.

Further, since the first transistor PM4 is turned off and the second transistor PM5 is turned off in the first controller 131, the voltage of the floating N-well node FNW may be come equal to the voltage of the second power source DVDD.

In operation modes (e.g., the programming mode and the reading mode) of the memory 102 to which power (e.g., DVDD or DVSS) is supplied, the switch 120 is turned on to provide the voltage VPP (or current) on the pad 101 for programming or reading to the memory 102.

Further, in the ESD protection mode in which power is cut off, even though a surge voltage occurs at the pad 101, the switch 120 may be blocked (i.e., turned off) to prevent current from flowing from the pad 101 to the memory 102. Further, since the floating N-well node FNW follows the voltage on the pad 101 in the ESD protection mode, it is possible to prevent leakage current from flowing to the bulk of the PMOS transistor PM1, the bulk of the first transistor PM4, or/and the bulk of the PMOS transistor PM3 of the second inverter 32.

As is apparent from the above description, embodiments of the disclosure may block surge current caused by electrostatic discharge at an input pad from being input into a memory or other internal circuit, and may prevent leakage current from the same cause from being applied to the internal circuit along the same path.

The embodiments as described above may include particular features, structures, or characteristics, but not every embodiment necessarily includes the particular features, structures, or characteristics (e.g., of other embodiments). Furthermore, the particular features, structures or characteristics in each embodiment may be combined in any suitable manner, as would be apparent to one of ordinary skill in the art from this disclosure, in one or more other embodiments. Therefore, combinations of features of different embodiments are meant to be within the scope of the invention.

What is claimed is:

1. An electrostatic discharge (ESD) protection circuit between a pad and a memory, comprising:
   an ESD detector connected between the pad and a first power source and configured to generate a detection signal when ESD is detected at the pad;
   a switch transistor including a gate controlled by the detection signal and a source and a drain connected between the pad and the memory; and
   a leakage current prevention circuit including a first transistor including a first gate connected to a second power source and a source and a drain connected between the pad and a first node, and a second transistor including a second gate connected to the pad and a source and a drain connected between the first node and the second power source,
   wherein the first node is connected to or in electrical communication with a bulk node of the switch transistor.

2. The ESD protection circuit according to claim 1, further comprising a floating N-well node connected to or in electrical communication with the first node.

3. The ESD protection according to claim 2, wherein the floating N-well node is connected to or in electrical communication with a bulk node of the first transistor.

4. The ESD protection circuit according to claim 2, wherein the floating N-well node is connected to or in electrical communication with a bulk node of the second transistor.

5. The ESD protection circuit according to claim 2, wherein the ESD detector comprises:
   a capacitor connected between the pad and a second node;
   a resistor connected between the second node and the first power source; and
   a discharge transistor including a gate connected to the second node, and a source and a drain connected between the pad and the first power source, and
   wherein the detection signal is output from the second node.

6. The ESD protection circuit according to claim 5, wherein the capacitor comprises a transistor including a gate connected to the second node and a source and a drain connected to the pad.

7. The ESD protection circuit according to claim 1, further comprising a buffer circuit configured to buffer the detection signal and apply the buffered detection signal to the gate of the switch transistor.

8. The ESD protection circuit according to claim 5, further comprising a first inverter and a second inverter connected in series, wherein the detection signal is input to the first inverter, and an output of the second inverter is input to the gate of the switch transistor.

9. The ESD protection circuit according to claim 5, further comprising:
a first P-type metal oxide semiconductor (PMOS) transistor including a gate connected to the second node and a source and a drain connected between the second power source and a third node;
a first N-type metal oxide semiconductor (NMOS) transistor including a gate connected to the second node and a source and a drain connected between the third node and the first power source;
a second PMOS transistor including a gate connected to the third node and a source and a drain connected between the pad and the gate of the switch transistor; and
a second NMOS transistor including a gate connected to the third node and a source and a drain connected between the first power source and the gate of the switch transistor.

10. The ESD protection circuit according to claim 1, wherein a voltage of the second power source is greater than a voltage of the first power source.

11. The ESD protection circuit according to claim 9, wherein the floating N-well node is connected to or in electrical communication with a bulk node of the second PMOS transistor.

12. The ESD protection circuit according to claim 2, wherein each of the first transistor and the second transistor comprises a PMOS transistor.

13. The ESD protection circuit according to claim 2, wherein the switch transistor comprises a PMOS transistor.

14. An electrostatic discharge (ESD) protection circuit connected between a pad and a memory, comprising:
an ESD detector connected between the pad and a first power source and configured to generate a detection signal when ESD is detected at the pad;
a switch transistor including a gate controlled by the detection signal and a source and a drain connected between the pad and the memory; and
a leakage current prevention circuit including a first transistor including a first gate connected to a second power source and a source and a drain connected between the pad and a first node, and a second transistor including a second gate connected to the pad and a source and a drain connected between the first node and the second power source,
wherein the first node is connected to or in electrical communication with a bulk node or the first transistor and a bulk node of the second transistor.

15. The ESD protection circuit according to claim 14, further comprising a floating N-well node connected to the first node,
wherein a voltage of the second power source is greater than a voltage of the first power source.

16. The ESD protection circuit according to claim 15, further comprising:
a first P-type metal oxide semiconductor (PMOS) transistor including a gate connected to a second node of the ESD detector outputting the detection signal, and a source and a drain connected between the second power source and a third node;
a first N-type metal oxide semiconductor (NMOS) transistor including a gate connected to the second node and a source and a drain connected between the third node and the first power source;
a second PMOS transistor including a gate connected to the third node and a source and a drain connected between the pad and the gate of the switch transistor; and
a second NMOS transistor including a gate connected to the third node and a source and a drain connected between the first power source and the gate of the switch transistor.

17. The ESD protection circuit according to claim 16, wherein the floating N-well node is connected to or in electrical communication with a bulk node of the switch transistor and a bulk node of the second PMOS transistor.

18. The ESD protection circuit according to claim 14, wherein the switch transistor comprises a PMOS transistor.

19. The ESD protection circuit according to claim 14, wherein each of the first transistor and the second transistor comprises a PMOS transistor.

20. An electrostatic discharge (ESD) protection circuit connected between a pad and a memory, comprising:
an ESD detector connected between the pad and a first power source and configured to generate a detection signal when ESD is detected at the pad;
a switch transistor including a gate controlled by the detection signal and a source and a drain connected between the pad and the memory;
a first transistor including a first gate connected to a second power source and a source and a drain connected between the pad and a first node, and a second transistor including a second gate connected to the pad, and a source and a drain connected between the first node and the second power source;
a first P-type metal oxide semiconductor (PMOS) transistor including a gate connected to a second node of the ESD detector outputting the detection signal, and a source and a drain connected between the second power source and a third node;
a first N-type metal oxide semiconductor (NMOS) transistor including a gate connected to the second node, and a source and a drain connected between the third node and the first power source;
a second PMOS transistor including a gate connected to the third node, and a source and a drain connected between the pad and the gate of the switch transistor; and
a second NMOS transistor including a gate connected to the third node, and a source and a drain connected between the first power source and the gate of the switch transistor,
wherein the first node is connected to at least one of a bulk node of the first transistor, a bulk node of the second transistor, a bulk node of the switch transistor, and a bulk node of the second PMOS transistor.

* * * * *